United States Patent [19]
Tsuru et al.

[11] Patent Number: 6,069,541
[45] Date of Patent: May 30, 2000

[54] HIGH-FREQUENCY FILTER, WITH AN INDUCTOR FOR FORMING A POLE, COMPLEX ELECTRONIC COMPONENT USING THE SAME, AND PORTABLE RADIO APPARATUS USING THE SAME

[75] Inventors: Teruhisa Tsuru, Kameoka; Tomoya Bando, Omihachiman; Ken Tonegawa, Otsu; Harufumi Mandai, Takatsuki, all of Japan

[73] Assignee: Murata Manufacturing Co., Ltd., Japan

[21] Appl. No.: 09/040,950

[22] Filed: Mar. 18, 1998

[51] Int. Cl.[7] .............................. H01P 1/213; H01P 1/201
[52] U.S. Cl. .......................... 333/134; 333/177; 333/185; 333/202
[58] Field of Search ................................... 333/175–177, 333/204, 205, 202, 134, 185

[56] References Cited

U.S. PATENT DOCUMENTS 3,718,874   2/1973   Cooper, Jr. ............................. 333/204
4,888,568  12/1989   Kawaguchi ......................... 333/185 X
5,521,564   5/1996   Kaneko et al. ...................... 333/185 X
5,525,942   6/1996   Horii et al. ............................. 333/134
5,834,992  11/1998   Kato et al. .............................. 333/185

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

A high-frequency filter 10 serving as a bandpass filter has three transmission lines SL11 to SL13 side-coupled in three stages. The transmission lines SL11 to SL13 are respectively connected in parallel to capacitors C11 to C13. One end of the input transmission line SL11 is connected to an input terminal Pi through an input capacitor C14. One end of the output transmission line SL13 is connected to an output terminal Po through an output capacitor C15. The other ends of the transmission lines SL11 and SL13 are connected and the connection point is connected to the ground through an inductor Lg for forming a pole in the transmission characteristic of the high-frequency filter. One end of the transmission line SL12 is connected to the ground.

16 Claims, 7 Drawing Sheets

2

HIGH-FREQUENCY FILTER, WITH AN INDUCTOR FOR FORMING A POLE, COMPLEX ELECTRONIC COMPONENT USING THE SAME, AND PORTABLE RADIO APPARATUS USING THE SAME

BACKGROUND OF THE INVENTION

1. Field of the Invention

The present invention relates to high-frequency filters, complex electronic components using the filters, and portable radio apparatuses using the filters or the components, and more particularly, to a high-frequency filter formed of a plurality of transmission lines side-coupled in a plurality of stages, a complex electronic component using the filter, and a portable radio apparatus using the filter or the electronic component.

2. Description of the Related Art

In recent years, compact, high-performance portable radio apparatuses have been increasingly developed in the mobile communication field. To this end, a high-frequency circuit needs to have higher performance. Among high-frequency circuits, a high-frequency filter, which has a great effect on the performance of a portable radio apparatus, is strongly required to be made compact and to have higher performance. A conventional side-coupled high-frequency filter using a transmission line will be described below. FIG. 10 is a block diagram of a conventional side-coupled high-frequency filter. A high-frequency filter 50 serving as a bandpass filter has three transmission lines SL51 to SL53 which are side-coupled in three stages. The transmission lines SL51 to SL53 are connected in parallel to capacitors C51 to C53 for parallel resonance, respectively. One end of the transmission line SL51 is connected to an input terminal Pi through an input capacitor C54. One end of the transmission line SL53 is connected to an output terminal Po through an output capacitor C55. The other ends of the transmission lines SL51 and SL53 and one end of the transmission line SL52 are connected to the ground.

In the above conventional high-frequency filter, however, as shown in FIG. 11, the frequency characteristic is gentle at both sides of the center frequency, no pole exists at both sides of the center frequency, and attenuation is insufficient in the vicinity of the center frequency.

SUMMARY OF THE INVENTION

The present invention has been made to solve the foregoing problems. Accordingly, it is an object of the present invention to provide a high-frequency filter having a pole at either the higher-frequency or lower-frequency side of the center frequency and sufficient attenuation in its frequency characteristic, a complex electronic component using the filter, and a portable radio apparatus using the filter or the electronic component.

In accordance with a first aspect, the present invention provides a high-frequency filter including: a plurality of transmission lines side-coupled in a plurality of stages; capacitors respectively connected in parallel to the plurality of transmission lines to form parallel resonance circuits, an input terminal connected through an input capacitor to one end of an input transmission line among the plurality of transmission lines; an output terminal connected through an output capacitor to one end of an output transmission line among the plurality of transmission lines; and an inductor for forming a pole in the transmission characteristic of the high-frequency filter, the inductor being provided between the ground and the connection point where the other end of the input transmission line is connected to the other end of the output transmission line.

According to the above high-frequency filter, since the other end of the input transmission line is connected to the other end of the output transmission line and the inductor for forming a pole in the transmission characteristic of the high-frequency filter, is provided between the connection point and the ground, a pole is formed at the higher-frequency or lower-frequency side of the center frequency and sufficient attenuation is ensured.

In accordance with a second aspect, the present invention also provides a high-frequency filter including: a plurality of transmission lines side-coupled in a plurality of stages; an input terminal connected to one end of an input transmission line among the plurality of transmission lines; and an output terminal connected to one end of an output transmission line among the plurality of transmission lines, wherein the other end of the input transmission line is connected to the other end of the output transmission line to form a closed circuit including the plurality of transmission lines between the input transmission line and the output transmission line; and the connection point between the other end of the input transmission line and the other end of the output transmission line is connected to the ground through an inductor for forming a pole in the transmission characteristic of the high-frequency filter.

According to the above high-frequency filter, since the other end of the input transmission line is connected to the other end of the output transmission line to form the closed circuit between the input transmission line and the output transmission line, and the connection point between the other end of the input transmission line and the other end of the output transmission line is connected to the ground through the inductor for forming a pole in the transmission characteristic of the high-frequency filter, due to a current flowing through the closed circuit, a pole is formed at the higher-frequency or lower-frequency side of the center frequency and sufficient attenuation is ensured.

The magnitude of the current flowing through the closed circuit can be changed by changing the inductance of the inductor for forming a pole. Therefore, since the frequency at the pole can be adjusted by the magnitude of the current flowing through the closed circuit, the attenuation at the pole at the higher-frequency or lower-frequency side of the center frequency and the position where the pole is formed can be easily changed.

In embodiments of the present invention, the above high-frequency filter may be configured such that it includes a dielectric substrate formed of a plurality of dielectric layers; the transmission lines, the capacitors for parallel resonance, the input capacitor, the output capacitor, and the inductor for forming a pole are formed inside the dielectric substrate; and the input terminal and the output terminal are formed on a surface of the dielectric substrate.

According to this structure, since the high-frequency filter is formed of the dielectric substrate, the transmission lines, the capacitors for parallel resonance, the input capacitor, the output capacitor, and the inductor for forming a pole of the high-frequency filter can be built in the dielectric substrate. Therefore, the high-frequency filter can be made compact.

The above high-frequency filter may be configured such that the inductor for forming a pole is formed of a via-hole electrode connecting a connection electrode, which connects the other end of the input transmission line to the other end of the output transmission line formed inside the dielectric substrate, to the ground electrode formed inside the dielectric substrate.

According to this structure, since the inductor for forming a pole is formed of the via-hole electrode connecting the connection electrode, which connects the end of the input transmission line to the end of the output transmission line formed inside the dielectric substrate, to the ground electrode formed inside the dielectric substrate, the inductance of the inductor for forming a pole can be easily specified in the design stage by adjusting the length or the diameter of the via-hole electrode. Therefore, the attenuation at the pole at the higher-frequency or lower-frequency side of the center frequency and the position where the pole is formed can be easily changed in the design stage.

The above high-frequency filter may be configured such that the dielectric substrate includes first to fifth dielectric layers; the transmission lines are formed of the ground electrode formed on the upper surface of the first dielectric layer and coil electrodes formed on the upper surface of the second dielectric layer; the inductor for forming a pole is formed of a via-hole electrode passing through the second dielectric layer; the input capacitor and the output capacitor are formed of first capacitor electrodes provided on the upper surface of the third dielectric layer and shield electrodes provided on the upper surface of the fifth dielectric layer; and the capacitors for parallel resonance are formed of second capacitor electrodes provided on the upper surface of the fourth dielectric layer and the shield electrodes provided on the upper surface of the fifth dielectric layer.

According to the high-frequency filter having this structure, since the transmission lines, the capacitors for parallel resonance, and the input and output and the output capacitors of the high-frequency filter are formed inside the dielectric substrate, the transmission lines, the capacitors for parallel resonance, the input capacitor, and the output capacitor can be electrically connected with via-hole electrodes formed inside the dielectric substrate. Therefore, since it is not necessary to provide external connecting means, when the filter is mounted on a circuit board, the filter is prevented from being short-circuited to conductive patterns on the board and other mounted components.

The present invention also provides a complex electronic component using the above high-frequency filter. In embodiments of such a complex electronic component, an amplifier is mounted on the dielectric substrate constituting the above high-frequency filter.

According to this complex electronic component, since the high-frequency filter is integrated with the amplifier, the number of parts constituting a receiving circuit or a transmitting circuit can be reduced. Therefore, the receiving circuit or the transmitting circuit is made compact and inexpensive.

In addition, since the impedance of the high-frequency filter and that of the amplifier can be designed in advance so as to match each other, it is not necessary to place a device for impedance matching between the high-frequency filter and the amplifier. Therefore, the gain of the receiving circuit or the transmitting circuit can be prevented from decreasing.

The present invention also provides a portable radio apparatus using the above high-frequency filter and/or the above complex electronic component. Such a radio apparatus includes an antenna; at least one of a receiving circuit and a transmitting circuit connected to the antenna, the receiving circuit and/or the transmitting circuit including the above high-frequency filter; and a casing for covering at least one of the receiving circuit and the transmitting circuit.

According to this portable radio apparatus, since the high-frequency filter having a good attenuation characteristic is used for the receiving circuit or the transmitting circuit of the portable radio apparatus, the portable radio apparatus having a good transmitting or receiving characteristic is obtained.

The present invention also provides a portable radio apparatus including: an antenna; at least one of a receiving circuit and a transmitting circuit connected to the antenna, the receiving circuit and/or the transmitting circuit including the above complex electronic component; and a casing for covering at least one of the receiving circuit and the transmitting circuit.

According to this portable radio apparatus, since the compact complex electronic component is used for the receiving circuit or the transmitting circuit of the portable radio apparatus, the portable radio apparatus is made compact.

Embodiments of the invention will be described herein with reference to the drawings, in which:

DESCRIPTION OF THE PREFERRED EMBODIMENT

Figure 1:
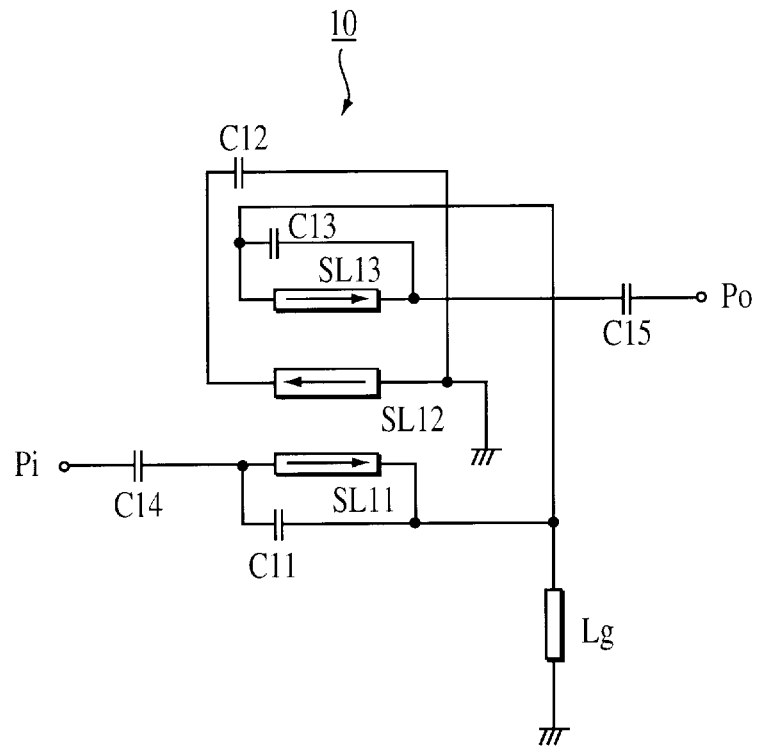
FIG. 1 is a block diagram of a high-frequency filter according to a first embodiment of the present invention.

Other features and advantages of the present invention will be made clearer with the following descriptions noted by referring to the drawings.

FIG. 1 is a block diagram of a high-frequency filter according to a first embodiment of the present invention. A high-frequency filter 10 serving as a bandpass filter has three transmission lines SL11 to SL13 side-coupled in three stages. The transmission lines SL11 to SL13 are connected in parallel to capacitors C11 to C13 for parallel resonance, respectively. One end of the input transmission line SL11 is connected to an input terminal Pi through an input capacitor C14. One end of the output transmission line SL13 is connected to an output terminal Po through an output capacitor C15. The other ends of the transmission lines SL11 and SL13 are connected to each other and the connection point is connected to the ground through an inductor Lg for forming a pole in the transmission characteristic of the high-frequency filter. One end of the transmission line SL12 is connected to the ground.

With the above structure, a closed circuit is formed which includes the input capacitor C14, the input transmission line SL11, the output transmission line SL13, and the output capacitor C15.

A high-frequency signal flows through the transmission lines SL11 to SL13 in the directions indicated by arrows in FIG. 1. Therefore, the end of the input transmission line SL11 from which a high-frequency signal flows out is connected to the end of the output transmission line SL13 into which the high-frequency signal flows.

Figure 2:
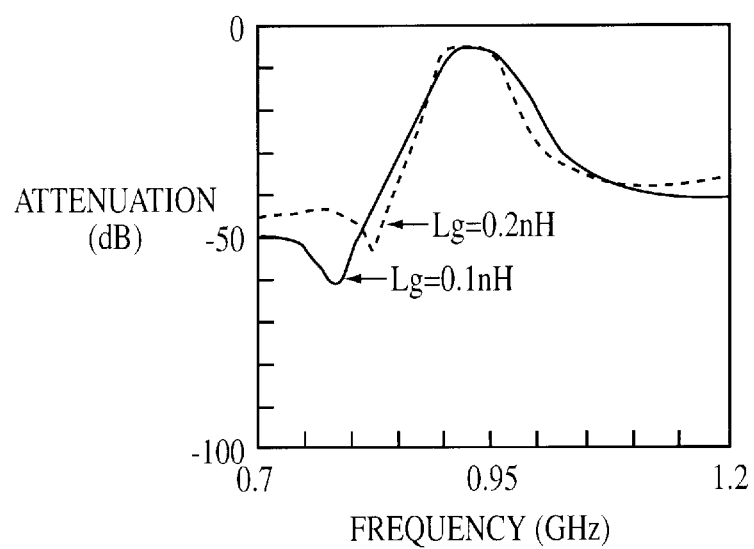
FIG. 2 is a view indicating the frequency characteristics of the high-frequency filter shown in FIG. 1.

FIG. 2 shows frequency characteristics of the high-frequency filter 10 having the structure shown in FIG. 1, with the inductance of the inductor Lg for forming a pole being set to 0.1 nH and 0.2 nH.

It is understood from the frequency characteristics shown in FIG. 2 that the high-frequency filter 10, shown in FIG. 1, has a pole at the lower-frequency side of the center frequency and has sufficient attenuation. In other words, when the end of the input transmission line SL11 from which a high-frequency signal flows out is connected to the end of the output transmission line SL13 into which the high-frequency signal flows, a pole is formed at the lower-frequency side of the center frequency.

It is also understood that the attenuation at the pole at the lower-frequency side of the center frequency becomes large as the inductance of the inductor Lg for forming a pole becomes small, and the pole approaches the center frequency as the inductance of the inductor Lg for forming a pole becomes large.

Figure 1A:
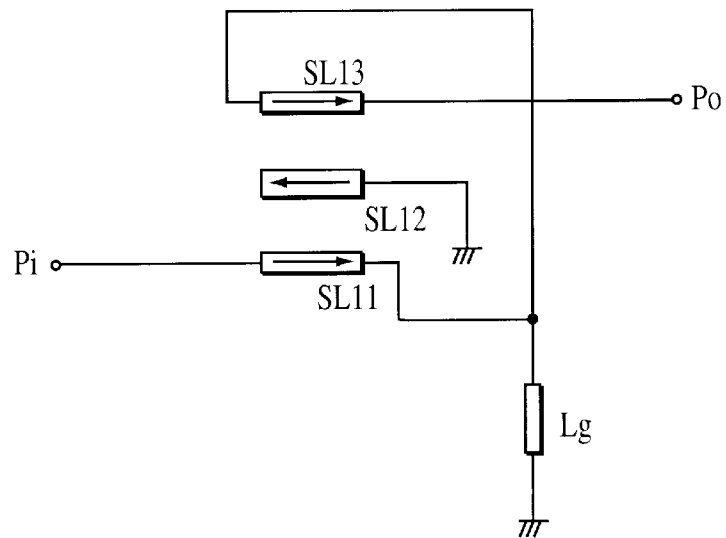
FIG. 1(a) is a block diagram of a modification of the high-frequency filter of FIG. 1.

FIG. 1(a) is a block diagram of a modification 10a of the high-frequency filter of FIG. 1. In this modification, the capacitors C11, C12, C13, C14 and C15 are eliminated from the high-frequency filter of FIG. 1. It should be noted that the capacitors C11, C12, C13, C14 and C15 are not essential features of the present invention.

Figure 3A:
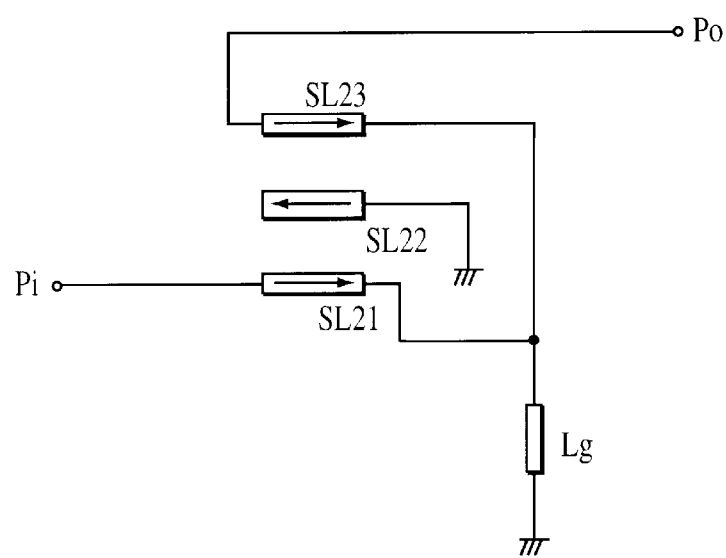
FIG. 3(a) is a block diagram of a modification of the high-frequency filter of FIG. 3.
Figure 3:
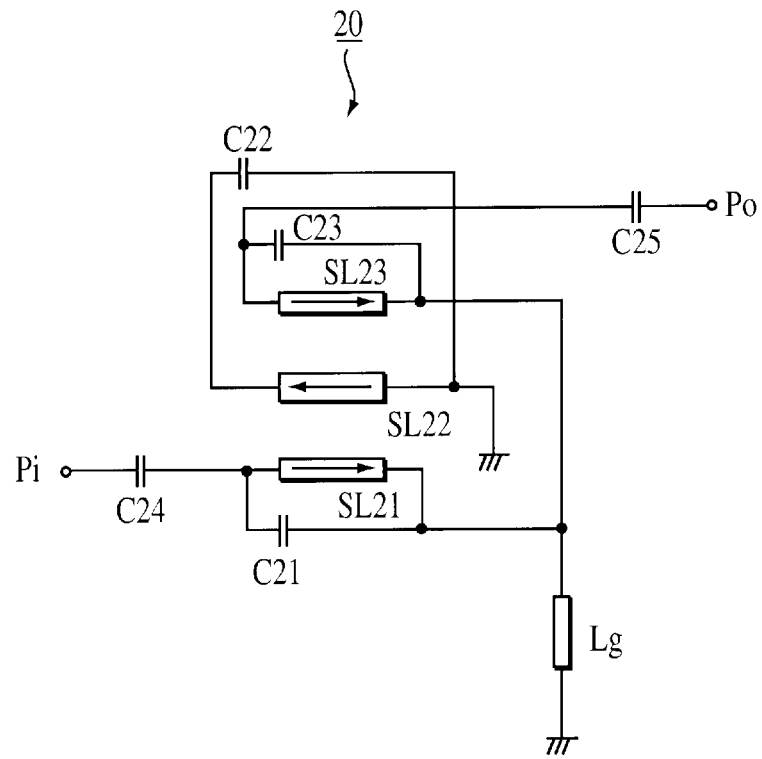
FIG. 3 is a block diagram of a high-frequency filter according to a second embodiment of the present invention.

FIG. 3 is a block diagram of a high-frequency filter according to a second embodiment of the present invention. A high-frequency filter 20 serving as a bandpass filter has three transmission lines SL21 to SL23 side-coupled in three stages. The transmission lines SL21 to SL23 are connected in parallel to capacitors C21 to C23 for parallel resonance, respectively. One end of the input transmission line SL21 is connected to an input terminal Pi through an input capacitor C24. One end of the output transmission line SL23 is connected to an output terminal Po through an output capacitor C25. The other ends of the transmission lines SL21 and SL23 are connected and the connection point is connected to the ground through an inductor Lg for forming a pole. One end of the transmission line SL22 is connected to the ground.

With the above structure, a closed circuit is formed between the input terminal and the output terminal, the circuit including the input capacitor C24, the input transmission line SL21, the output transmission line SL23, and the output capacitor C25.

A high-frequency signal flows through the transmission lines SL21 to SL23 in the directions indicated by arrows in FIG. 3. Therefore, the end of the input transmission line SL21 from which a high-frequency signal flows out is connected to the end of the output transmission line SL23 from which the high-frequency signal flows out.

Figure 4:
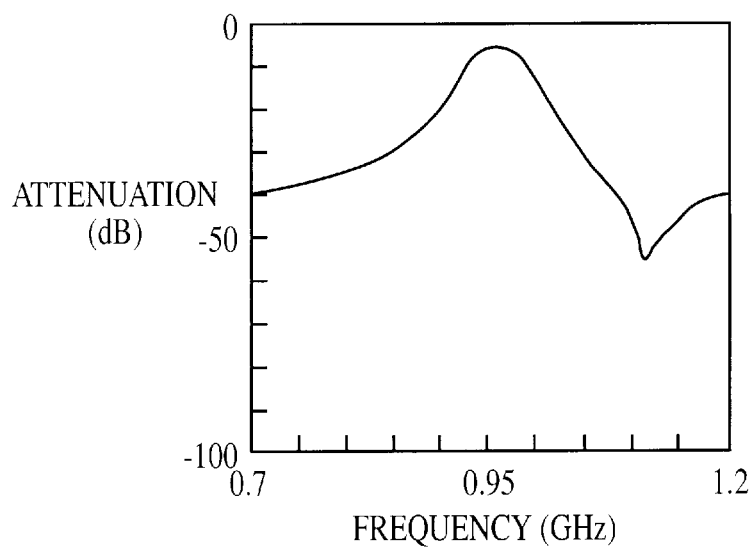
FIG. 4 is a view indicating the frequency characteristics of the high-frequency filter shown in FIG. 3.

FIG. 4 shows a frequency characteristic of the high-frequency filter 20 having the structure shown in FIG. 3, with the inductance of the inductor Lg for forming a pole being set to 0.2 nH.

It is understood from the frequency characteristic shown in FIG. 4 that the high-frequency filter 20, shown in FIG. 3, has a pole at the higher-frequency side of the center frequency and has sufficient attenuation. In other words, when the end of the input transmission line SL21 from which a high-frequency signal flows out is connected to the end of the output transmission line SL23 from which the high-frequency signal flows out, a pole is formed at the higher-frequency side of the center frequency.

FIG. 3(a) is a block diagram of a modification 20a of the high-frequency filter of FIG. 3. In this modification, the capacitors C21, C22, C23, C24 and C25 are eliminated from the high frequency filter of FIG. 3. It should be noted that the capacitors C21, C22, C23, C24 and C25 are not essential features of the present invention.

Figure 5:
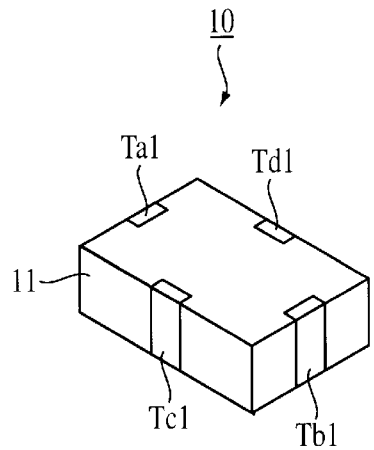
FIG. 5 is a perspective view of the high-frequency filter shown in FIG. 1.

FIG. 5 is a perspective view of the high-frequency filter 10, shown in FIG. 1. The high-frequency filter 10 includes a dielectric substrate 11. Inside the dielectric substrate 11, the transmission lines SL11 to SL13, the capacitors C11 to C13 for parallel resonance, the input capacitor C14, the output capacitor C15, and the inductor Lg for forming a pole are formed to constitute the high-frequency filter 10. On the surfaces of the dielectric substrate 11, an outer terminal Ta1 is formed from the vicinity of one short edge on the upper surface across the side face to which this edge is adjacent, to the vicinity of one short edge on the lower surface, an outer terminal Tb1 is formed from the vicinity of the other short edge on the upper surface across the side face to which the edge is adjacent, to the vicinity of the other short edge on the lower surface, an outer terminal Tc1 is formed from the vicinity of one long edge on the upper surface across the side face to which this edge is adjacent, to the vicinity of one long edge on the lower surface, and an outer terminal Td1 is formed from the vicinity of the other long edge on the upper surface across the side face to which the edge is adjacent, to the vicinity of the other long edge on the lower surface.

Figure 6:
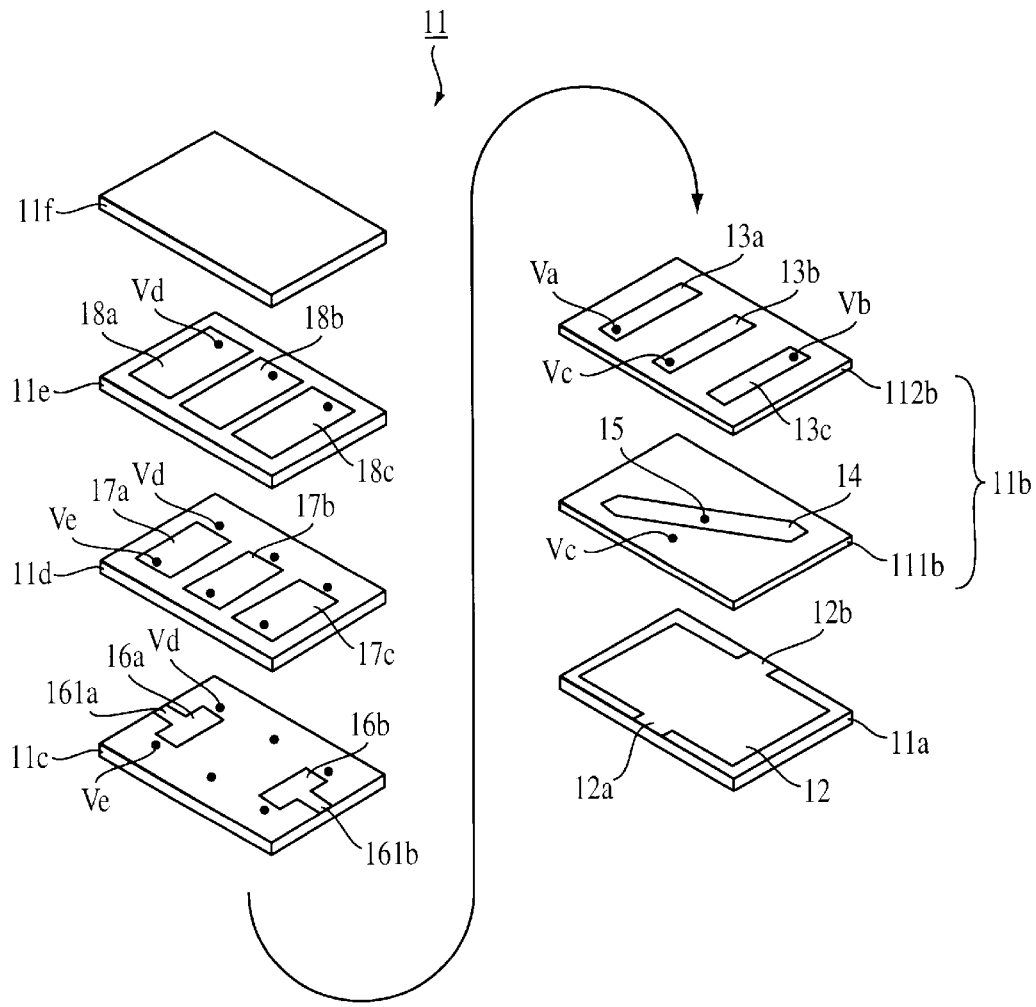
FIG. 6 is an exploded perspective view of a dielectric substrate used for the high-frequency filter shown in FIG. 5.

FIG. 6 is an exploded perspective view of the dielectric substrate constituting the high-frequency filter 10, shown in FIG. 5. The dielectric substrate 11 is formed by laminating first to sixth dielectric layers 11a to 11f. Among them, a ground electrode 12 is formed substantially on the whole surface of the first dielectric layer 11a. Two lead terminals 12a and 12b are formed toward both long sides of the first dielectric layer 11a from the ground electrode 12.

The second dielectric layer 11b is laminated on the ground electrode 12. On the surface of the layer, three rectangular coil electrodes 13a to 13c which constitute part of the transmission lines SL11 to SL13 (FIG. 1) are formed oppositely to the ground electrode 12 on the fist dielectric layer 11a. The coil electrodes 13a to 13c are formed substantially in parallel with some intervals at the center and the vicinities of both short sides of the second dielectric layer 11b.

The second dielectric layer 11b is formed of a first layer 111b and a second layer 112b. A connection electrode 14 is formed on the surface of the first layer 111b, and via-hole electrodes Va and Vb are formed inside the second layer 112b so as to pass through the layer. By the connection electrode 14 and the via-hole electrodes Va and Vb, one end of the coil electrode 13a is connected to an end of the coil electrode 13c.

Inside the first layer 111b and the second layer 112b, a via-hole electrode Vc is formed so as to pass through the layers. By this via-hole electrode Vc, one end of the coil electrode 13b on the second dielectric layer 11b is connected to the ground electrode 12 on the first dielectric layer 11a.

A via-hole electrode 15 which constitutes the inductor Lg (FIG. 1) for forming a pole is formed inside the second layer 112b so as to pass through the layer. By this via-hole electrode 15, the connection electrode 14 on the first layer 111b is connected to the ground electrode 12 on the first dielectric layer 11a.

On the coil electrodes 13a to 13c, the third dielectric layer 11c is laminated. Two first capacitor electrodes 16a and 16b which constitute part of the input and output capacitors C14 and C15 (FIG. 1) are formed on the surface of the third dielectric layer 11c. The first capacitor electrodes 16a and 16b are formed in the vicinities of both short sides of the third dielectric layer 11c. Lead terminals 161a and 161b are formed toward the short sides of the third dielectric layer 11c from the capacitor electrodes 16a and 16b.

On the first capacitor electrodes 16a and 16b, the fourth dielectric layer 11d is laminated. Three second capacitor electrodes 17a to 17c which constitute part of the capacitors C11 to C13 (FIG. 1) for parallel resonance are formed on the surface of the layer. The second capacitor electrodes 17a to 17c are formed in parallel with some intervals close to one long side of the fourth dielectric layer 11d.

On the second capacitor electrodes 17a to 17c, the fifth dielectric layer 11e is laminated. Three shield electrodes 18a to 18c are formed on the surface of the fifth dielectric layer 11e. The shield electrodes 18a to 18c are formed in parallel with some intervals on the fifth dielectric layer 11e so as to oppose the second capacitor electrodes 17a to 17c on the fourth dielectric layer 11d. Then, the sixth dielectric layer 11f is laminated on the shield electrodes 18a to 18c.

To electrically connect the coil electrodes 13a to 13c on the second dielectric layer 11b to the shield electrodes 18a to 18c on the fifth dielectric layer 11e, via-hole electrodes Vd are formed in the third to fifth dielectric layers 11c to 11e. To electrically connect the coil electrodes 13a to 13c on the second dielectric layer 11b to the second capacitor electrodes 17a to 17c on the fourth dielectric layer 11d, via-hole electrodes Ve are formed in the third and fourth dielectric layers 11c and 11d.

Electrode paste is applied to the first to the sixth dielectric layers 11a to 11f formed by laminating, for example, dielectric ceramic green sheets, in the shapes of the ground electrode 12, the coil electrodes 13a to 13c, the connection electrode 14, the first and second capacitor electrodes 16a, 16b, and 17a to 17c, the shield electrodes 18a to 18c, and the lead terminals 12a, 12b, 161a, and 161b, the via-hole electrodes 15 and Va to Ve are filled with electrode paste, and the layers are laminated and baked to form the dielectric substrate 11. According to the thickness of each of the first to the sixth dielectric layers 11a to 11f, the number of dielectric ceramic green sheets to be laminated is adjusted.

Next, at the side faces of the dielectric substrate 11, the lead terminal 161a formed at the first capacitor electrode 16a on the third dielectric layer 11c is connected to the outer terminal Ta1, which serves as the input terminal Pi (FIG. 1), the lead terminal 161b formed at the first capacitor electrode 16b on the third dielectric layer 11c is connected to the outer terminal Tb1, which serves as the output terminal Po (FIG. 1), and the lead terminals 12a and 12b formed at the ground electrode 12 on the first dielectric layer 11a are connected to the outer terminals Tc1 and Td1, which serve as ground terminals, to complete the high-frequency filter 10.

The outer terminals Ta1 to Td1 may be formed in such a way that electrode paste is applied before the dielectric substrate 11 is baked and then they are baked as a unit. The outer terminals Ta1 to Td1 may be formed in such a way that electrode paste is applied after the dielectric substrate 11 is baked and then the paste is baked.

With the above structure, the transmission lines SL11 to SL13 (FIG. 1) in the high-frequency filter 10 are formed of the ground electrode 12 formed on the first dielectric layer 11a and the coil electrodes 13a to 13c formed on the second dielectric layer 11b, respectively.

The inductor Lg (FIG. 1) for forming a pole in the transmission characteristic of the high-frequency filter 10 is formed of the via-hole electrode 15 passing through the first layer 111b of the second dielectric layer 11b.

The capacitors C11 to C13 (FIG. 1) for parallel resonance in the high-frequency filter 10 are respectively formed of the second capacitor electrodes 17a to 17c formed on the fourth dielectric layer 11d and the shield electrodes 18a to 18c formed on the fifth dielectric layer 11e.

The input and output capacitors C4 and C5 (FIG. 1) in the high-frequency filter 10 are respectively formed of the first capacitor electrodes 16a and 16b formed on the third dielectric layer 11c and the shield electrodes 18a and 18c formed on the fifth dielectric layer 11e.

The dielectric substrate constituting the high-frequency filter 10 according to the second embodiment can be made in the same way. Moreover, the modifications of the high-frequency filter shown in FIGS. 1(a) and 3(a) can be made in an analogous manner by omitting structures which are only required for the capacitors which are used to form parallel resonance circuits with the respective transmission lines.

According to the high-frequency filters of the first and second embodiments, and the modified embodiments, since one end of the input transmission line is connected to one end of the output transmission line and the connection point is connected to the ground through the inductor for forming a pole, the pole is formed either at the higher-frequency or lower-frequency side of the center frequency and sufficient attenuation is ensured.

By setting the end of the output transmission line to be connected to the end of the input transmission line to the end from which a high-frequency signal flows out or the end into which a high-frequency signal flows, the pole is formed either at the higher-frequency or lower-frequency side of the center frequency.

By changing the inductance of the inductor for forming a pole, attenuation at the pole positioned either at the higher-frequency or lower-frequency side of the center frequency is easily changed and the pole position is also changed.

In addition, as shown in FIG. 5, when the high-frequency filter is formed of a dielectric substrate, since the transmission lines, the capacitors for parallel resonance, the input and output capacitors, and the inductor for forming a pole, all of which constitute the high-frequency filter, can be built in the dielectric substrate, the high-frequency filter can be made compact.

Since the transmission lines, the capacitors for parallel resonance, and the input and output and output capacitors are electrically connected by the via-hole electrodes provided inside the dielectric substrate, it is not necessary to form external connection means. Therefore, when the filter is mounted on a circuit board, the filter is prevented from being short-circuited to wiring on the circuit board and other mounted components.

Figure 7:
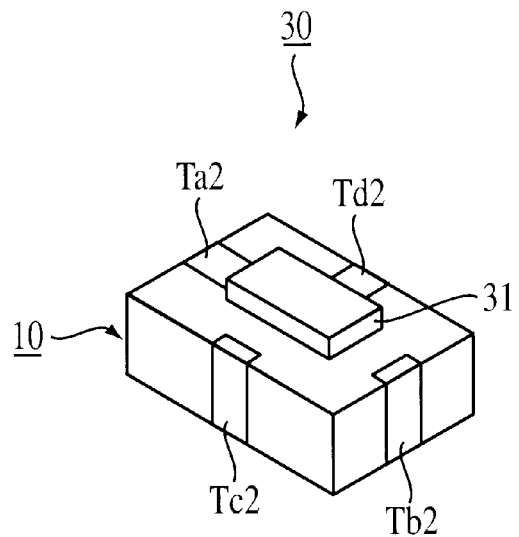
FIG. 7 is a perspective view of a complex electronic component according to an embodiment of the present invention.

FIG. 7 is a perspective view of a complex electronic component using a high-frequency filter according to an embodiment of the present invention. In the complex electronic component 30, an amplifier 31 is mounted on the upper surface of the high-frequency filter 10 shown in FIG. 5 to combine the high-frequency filter 10 and the amplifier 31 as a unit.

An outer terminal Ta2 serves as an input terminal of the amplifier 31 and an outer terminal Tb2 serves as an output terminal of the high-frequency filter 10. The output of the amplifier 31 is connected to the input of the high-frequency filter 10 on the surface or inside the high-frequency filter 10. Outer terminals Tc2 and Td2 serve as ground terminals of the high-frequency filter 10.

When the high-frequency filter 10 was actually set to serve as a bandpass filter and the amplifier 31 as a low-noise amplifier, both of which constitute the complex electronic component 30, the measured gain was 19.6 dB between the outer terminal Ta2, which serves as an input terminal, and the outer terminal Tb2, which serves as an output terminal. This value is higher by 3 dB than the gain, 16.7 dB, obtained in a case when the bandpass filter and the low-noise amplifier were separated. This indicates that integrating the bandpass filter with the low-noise amplifier prevents the gain from decreasing.

According to the complex electronic component of the foregoing embodiment, since the high-frequency filter is integrated with an amplifier, such as a combination of the bandpass filter and a low-noise amplifier or the bandpass filter and a high-output amplifier, the number of parts used for a receiving circuit or a transmitting circuit can be reduced. Therefore, the receiving circuit or the transmitting circuit can be made compact and inexpensive.

Since the impedance of the high-frequency filter and that of the amplifier can be designed in advance so as to match each other, it is not required to place a device for impedance matching between the high-frequency filter and the amplifier. Therefore, the gain of the receiving circuit or the transmitting circuit is prevented from decreasing.

Figure 8:
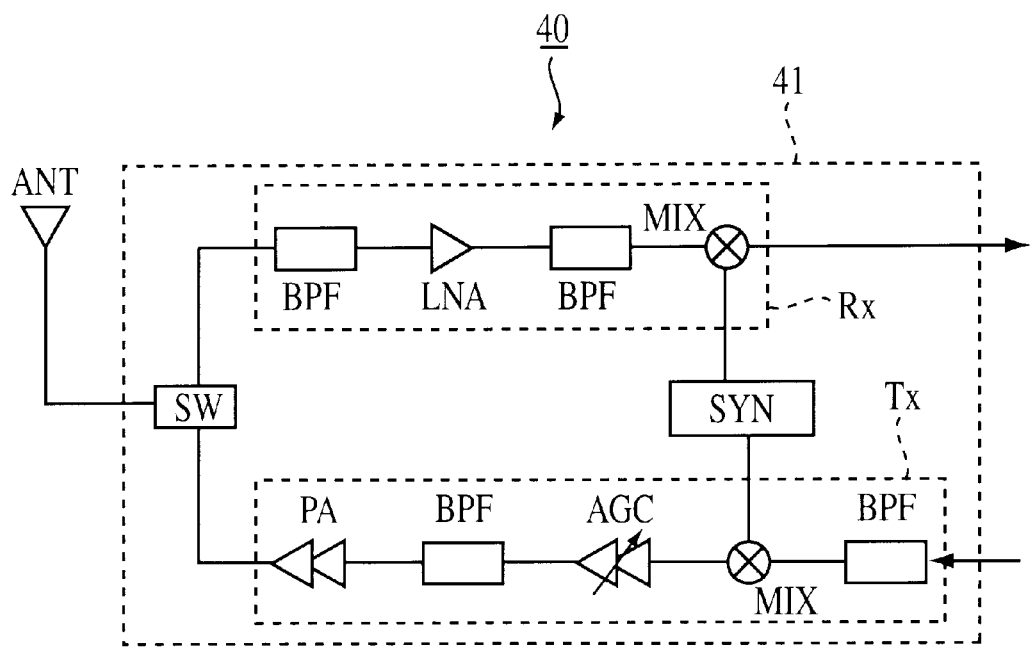
FIG. 8 is an RF block diagram of a general portable radio apparatus.

FIG. 8 is an RF block diagram of a portable telephone, which is a general portable radio apparatus. A portable telephone 40 includes an antenna ANT, a receiving circuit Rx and a transmitting circuit Tx both connected to the antenna ANT through a switch SW, the switch SW, and a casing 41 which covers the receiving circuit Rx and the transmitting circuit Tx.

The receiving circuit Rx is formed of bandpass filters BPFs, a low-noise amplifier LNA, and a mixer MIX. The transmitting circuit Tx is formed of bandpass filters BPFs, a high-output amplifier PA, an automatic gain controller AGC, and a mixer MIX.

In the receiving circuit Rx or the transmitting circuit Tx in the portable telephone 40, shown in FIG. 8, the high-frequency filters 10, 10a, 20, and 20a, shown in FIGS. 1 and 3, can be used for a bandpass filter BPF which passes a signal having the receiving frequency or a signal having the transmitting frequency.

In the receiving circuit Rx of the portable telephone 40, shown in FIG. 8, the high-frequency filter 10 of the complex electronic component 30, shown in FIG. 7, can be used for the bandpass filter BPF for passing a signal having the receiving frequency and the amplifier 31 of the complex electronic component 30 can be used for the low-noise amplifier LNA for amplifying a signal having the receiving frequency.

Also in the transmitting circuit Tx of the portable telephone 40, shown in FIG. 8, the high-frequency filter 10 of the complex electronic component 30 can be used for the bandpass filter BPF for passing a signal having the transmitting frequency and the amplifier 31 of the complex electronic component 30 can be used for the high-output amplifier PA for amplifying a signal having the transmitting frequency.

Figure 9:
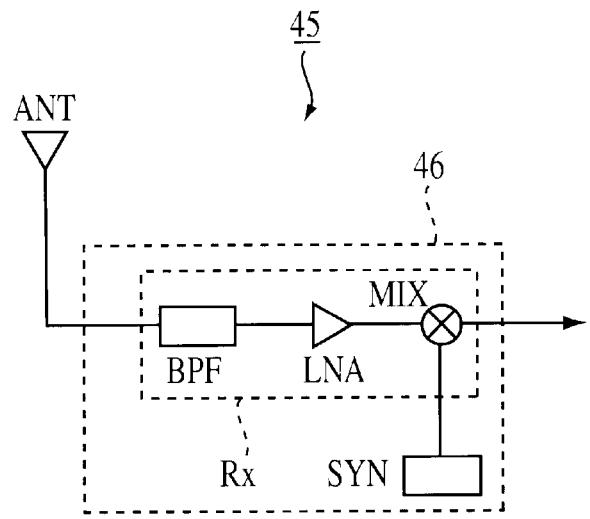
FIG. 9 is an RF block diagram of another general portable radio apparatus.
Figure 10:
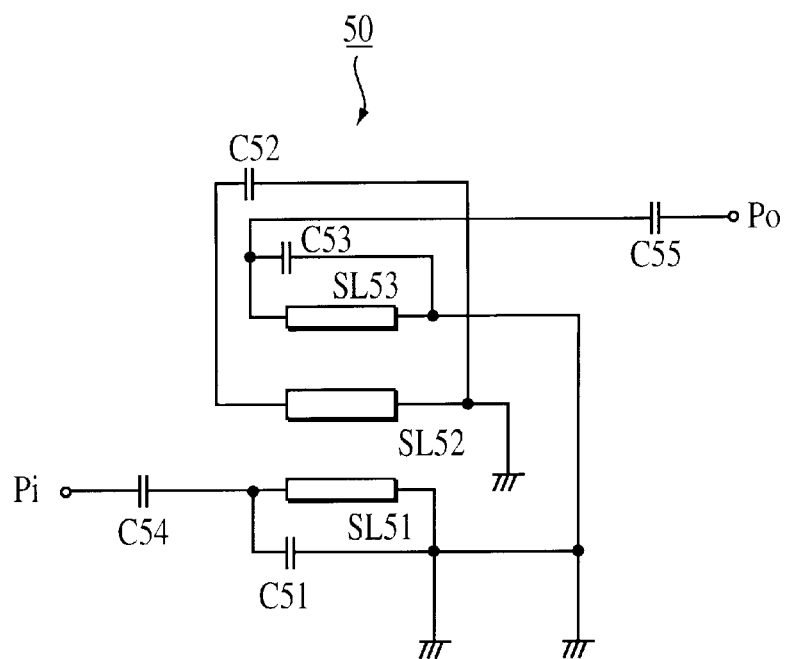
FIG. 10 is a block diagram of a conventional high-frequency filter.
Figure 11:
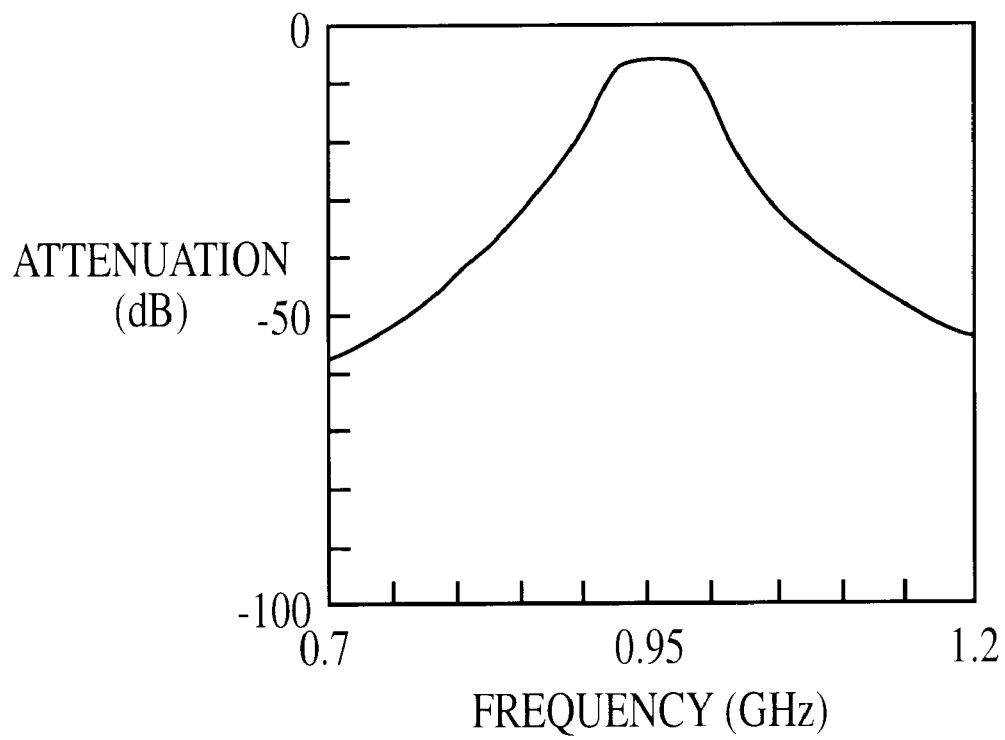
FIG. 11 is a view indicating the frequency-characteristics of the high-frequency filter shown in FIG. 10.

FIG. 9 is an RF block diagram of a pager, which is a general portable radio apparatus. A pager 45 includes an antenna ANT, a receiving circuit Rx connected to the antenna ANT, and a casing 41 which covers the receiving circuit Rx. The receiving circuit Rx is formed of a bandpass filter BPF, a low-noise amplifier LNA, and a mixer MIX.

In the receiving circuit Rx of the pager 45, shown in FIG. 9, the high-frequency filters 10, 10a, 20, and 20a, shown in FIGS. 1, 1(a), 3, and 3(a), can be used for the bandpass filter BPF which passes a signal having the receiving frequency.

In the receiving circuit Rx of the pager 45, shown in FIG. 9, the high-frequency filter 10 of the complex electronic component 30, shown in FIG. 7, can be used for the bandpass filter BPF for passing a signal having the receiving frequency and the amplifier 31 of the complex electronic component 30 can be used for the low-noise amplifier LNA for amplifying a signal having the receiving frequency.

According to the portable radio apparatus of the above embodiment, since a high-frequency filter having a good attenuation characteristic is used for the receiving circuit or the transmitting circuit of the portable radio apparatus, the portable radio apparatus having good transmitting and receiving characteristics is obtained.

Since a compact complex electronic component is used for the receiving circuit or the transmitting circuit of the portable radio apparatus, the apparatus can be made compact.

In the high-frequency filters according to the above first and second embodiments, the filters have three transmission lines side-coupled in three stages. The number of transmission lines to be side-coupled is not limited to three. A plurality of side-coupled transmission lines generate the same advantages.

The complex electronic component according to the above embodiment has one high-frequency filter. A plurality of high-frequency filters may be built in one dielectric substrate. In this case, the number of parts in the receiving circuit and the transmitting circuit can be further reduced. As a result, the receiving circuit and the transmitting circuit can be made more compact.

When two high-frequency filters are used, for example, the two high-frequency filters of the complex electronic component can be used for the two bandpass filters BPFs and the amplifier of the complex electronic component can be used for the low-noise amplifier LNA in the receiving circuit Rx of the portable telephone 40, shown in FIG. 8. Also in the transmitting circuit Tx, the two high-frequency filters of the complex electronic component can be used for the two bandpass filters BPFs and the amplifier of the complex electronic component can be used for the high-output amplifier PA.

The present invention has been disclosed and described in relation to its preferable embodiments. Those skilled in the art can understand that the above and other modifications may be performed within the scope of the present invention.

What is claimed is:

1. A high-frequency filter comprising: a plurality of transmission lines side-coupled in a plurality of stages; capacitors for parallel resonance respectively connected in parallel to said plurality of transmission lines, an input terminal connected through an input capacitor to one end of an input transmission line among said plurality of transmission lines; an output terminal connected through an output capacitor to one end of an output transmission line among said plurality of transmission lines; and an inductor for forming a pole provided between a ground and a connection point where the other end of said input transmission line is connected to the other end of said output transmission line.

2. A high-frequency filter according to claim 1, wherein the end of said input transmission line from which a high-frequency signal flows out is connected to the end of said output transmission line from which a high-frequency signal flows out.

3. A portable radio apparatus comprising: an antenna; at least one of a receiving circuit and a transmitting circuit connected to said antenna, each circuit including a high-frequency filter according to claim 1; and a casing for covering at least one of said receiving circuit and said transmitting circuit.

4. A high-frequency filter according to claim 1, wherein the end of said input transmission line from which a high-frequency signal flows out is connected to the end of said output transmission line into which a high-frequency signal flows.

5. A high-frequency filter according to claim 1, comprising a dielectric substrate formed of a plurality of dielectric layers, wherein said transmission lines, said capacitors for parallel resonance, said input capacitor, said output capacitor, and said inductor for forming a pole are formed inside said dielectric substrate; and said input terminal and said output terminal are formed on a surface of said dielectric substrate.

6. A high-frequency filter according to claim 5, wherein said inductor for forming a pole is formed of a via-hole electrode connecting a connection electrode, which connects the other end of said input transmission line to the other end of said output transmission line formed inside said dielectric substrate, to a ground electrode formed inside said dielectric substrate.

7. A high-frequency filter according to claim 5, wherein said dielectric substrate includes first to fifth dielectric layers; said transmission lines are formed of a ground electrode formed on the upper surface of said first dielectric layer and coil electrodes formed on the upper surface of said second dielectric layer; said inductor for forming a pole is formed of a via-hole electrode passing through said second dielectric layer; said input capacitor and said output capacitor are formed of first capacitor electrodes provided for the upper surface of said third dielectric layer and shield electrodes provided for the upper surface of said fifth dielectric layer; and said capacitors for parallel resonance are formed of second capacitor electrodes provided for the upper surface of said fourth dielectric layer and said shield electrodes provided for the upper surface of said fifth dielectric layer.

8. A complex electronic component, comprising an amplifier mounted on said dielectric substrate of said high-frequency filter according to claim 5, and connected to said high-frequency filter.

9. A portable radio apparatus comprising: an antenna; at least one of a receiving circuit and a transmitting circuit connected to said antenna, each circuit including a complex electronic component according to claim 8; and a casing for covering at least one of said receiving circuit and said transmitting circuit.

10. A high-frequency filter comprising: a plurality of transmission lines side-coupled in a plurality of stages; an input terminal connected to one end of an input transmission line among said plurality of transmission lines; and an output terminal connected to one end of an output transmission line among said plurality of transmission lines wherein the other end of said input transmission line is connected to the other end of said output transmission line to form a closed circuit including said plurality of transmission lines between said input transmission line and said output transmission line; and a connection point between the other end of said input transmission line and the other end of said output transmission line is connected to a ground through an inductor for forming a pole;

capacitors for parallel resonance respectively connected in parallel to said plurality of transmission lines;

an input capacitor interconnecting said input terminal and said one end of said input transmission line;

an output capacitor interconnecting said output terminal and said one end of said output transmission line;

wherein the end of said input transmission line from which a high-frequency signal flows out is connected to the end of said output transmission line from which a high-frequency signal flows out.

11. A high-frequency filter according to claim 10, comprising a dielectric substrate formed of a plurality of dielectric layers, wherein said transmission lines, said capacitors for parallel resonance, said input capacitor, said output capacitor, and said inductor for forming a pole are formed inside said dielectric substrate; and said input terminal and said output terminal are formed on a surface of said dielectric substrate.

12. A high-frequency filter according to claim 11, wherein said inductor for forming a pole is formed of a via-hole electrode connecting a connection electrode, which connects the other end of said input transmission line to the other end of said output transmission line formed inside said dielectric substrate, to a ground electrode formed inside said dielectric substrate.

13. A complex electronic component, comprising an amplifier mounted on said dielectric substrate of said high-frequency filter according to claim 11, and connected to said high-frequency filter.

14. A portable radio apparatus comprising: an antenna; at least one of a receiving circuit and a transmitting circuit connected to said antenna, each circuit including a complex electronic component according to claim 13; and a casing for covering at least one of said receiving circuit and said transmitting circuit.

15. A portable radio apparatus comprising: an antenna; at least one of a receiving circuit and a transmitting circuit connected to said antenna, each circuit including a high-frequency filter according to claim 10; and a casing for covering at least one of said receiving circuit and said transmitting circuit.

16. A high-frequency filter comprising:
a plurality of transmission lines side-coupled in a plurality of stages; an input terminal connected to one end of an input transmission line among said plurality of transmission lines; and an output terminal connected to one end of an output transmission line among said plurality of transmission lines, wherein the other end of said input transmission line is connected to the other end of said output transmission line to form a closed circuit including said plurality of transmission lines between said input transmission line and said output transmission line; and a connection point between the other end of said input transmission line and the other end of said output transmission line is connected to a ground through an inductor for forming a pole;

capacitors for parallel resonance respectively connected in parallel to said plurality of transmission lines;

an input capacitor interconnecting said input terminal and said one end of said input transmission line;

an output capacitor interconnecting said output terminal and said one end of said output transmission line;

a dielectric substrate formed of a plurality of dielectric layers, wherein said transmission lines, said capacitors for parallel resonance, said input capacitor, said output capacitor, and said inductor for forming a pole are formed inside said dielectric substrate; and said input terminal and said output terminal are formed on a surface of said dielectric substrate;

wherein said dielectric substrate includes first to fifth dielectric layers; said transmission lines are formed of a ground electrode formed on the upper surface of said first dielectric layer and coil electrodes formed on the upper surface of said second dielectric layer; said inductor for forming a pole is formed of a via-hole electrode passing through said second dielectric layer; said input capacitor and said output capacitor are formed of first capacitor electrodes provided on the upper surface of said third dielectric layer and shield electrodes provided on the upper surface of said fifth dielectric layer; and said capacitors for parallel resonance are formed of second capacitor electrodes provided on the upper surface of said fourth dielectric layer and said shield electrodes provided on the upper surface of said fifth dielectric layer.

* * * * *